(12) United States Patent
Chen et al.

(10) Patent No.: US 10,985,231 B2
(45) Date of Patent: Apr. 20, 2021

(54) DISPLAY DEVICE

(71) Applicant: Au Optronics Corporation, Hsinchu (TW)

(72) Inventors: Peng-Yu Chen, Hsinchu (TW); Ya-Pei Kuo, Hsinchu (TW); Hong-Shiung Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/361,236

(22) Filed: Mar. 22, 2019

(65) Prior Publication Data

US 2020/0052059 A1    Feb. 13, 2020

Related U.S. Application Data

(60) Provisional application No. 62/717,036, filed on Aug. 10, 2018.

(30) Foreign Application Priority Data

Dec. 12, 2018   (TW) .................. 107144743

(51) Int. Cl.
   *H01L 27/32*   (2006.01)

(52) U.S. Cl.
   CPC ...... *H01L 27/3276* (2013.01); *H01L 27/3213* (2013.01); *H01L 27/3288* (2013.01)

(58) Field of Classification Search
   CPC ............. H01L 27/3211; H01L 27/3213; H01L 27/3244; H01L 27/3246; H01L 27/3248; H01L 27/3258; H01L 27/326; H01L 27/3276; H01L 27/3288
   See application file for complete search history.

(56) References Cited

U.S. PATENT DOCUMENTS

| | | | |
|---|---|---|---|
| 10,403,855 B2 | 9/2019 | Liang et al. | |
| 10,826,001 B2 | 11/2020 | Zhou | |
| 2005/0093784 A1* | 5/2005 | Sakurai | H01L 27/3251 345/76 |
| 2017/0277219 A1 | 9/2017 | Chung et al. | |
| 2019/0036047 A1 | 1/2019 | Zhou | |
| 2019/0123306 A1 | 4/2019 | Liang et al. | |

FOREIGN PATENT DOCUMENTS

| | | |
|---|---|---|
| CN | 206451466 | 8/2017 |
| CN | 107425042 | 12/2017 |
| CN | 107682489 | 2/2018 |
| CN | 107768545 | 3/2018 |
| CN | 107863448 | 3/2018 |
| CN | 207338380 | 5/2018 |
| CN | 108257514 | 7/2018 |

* cited by examiner

Primary Examiner — Julio J Maldonado
Assistant Examiner — Molly K Reida
(74) Attorney, Agent, or Firm — JCIPRNET

(57) ABSTRACT

A display device includes a substrate, a plurality of active pixels, and a plurality of passive pixels. The substrate has a first display region and a second display region connected to the first display region. The plurality of passive pixels are disposed on the first display region. The plurality of active pixels are disposed on the second display region.

16 Claims, 7 Drawing Sheets

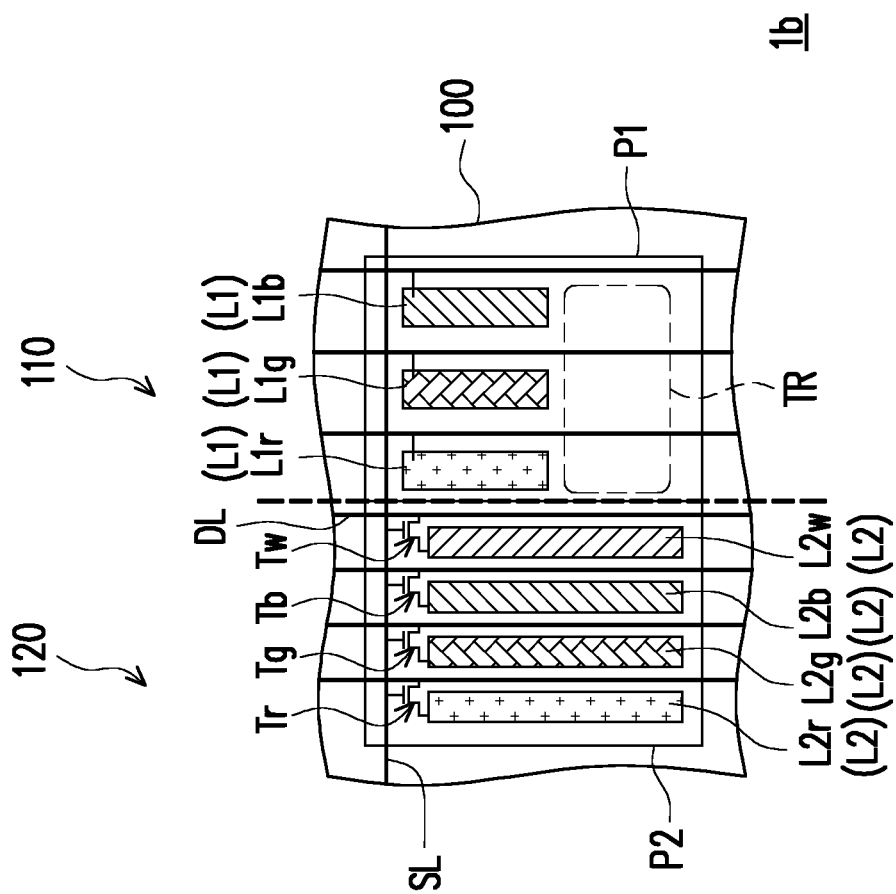

DISPLAY DEVICE

CROSS-REFERENCE TO RELATED APPLICATION

This application claims the priority benefits of U.S. provisional application Ser. No. 62/717,036, filed on Aug. 10, 2018, and Taiwan application serial no. 107144743, filed on Dec. 12, 2018. The entirety of each of the above-mentioned patent applications is hereby incorporated by reference herein and made a part of this specification.

BACKGROUND

Technical Field

The present invention relates to a display device, and more particularly to a display device including two pixels.

Description of Related Art

Currently, in order to increase the ease of use of products, many manufacturers combine display devices with cameras. For example, camera functions are often included in existing mobile phones or tablets. In an existing mobile phone or tablet, in order to provide a sufficient border region to set the front lens, the area of the display region is often limited. For example, the display panel is often drilled in the border region to set the lens of the camera. However, the portion of the drilled hole does not have the display function, and the area of the display region which can display images is limited.

SUMMARY

An embodiment of the invention provides a display device including a substrate, a plurality of active pixels, and a plurality of passive pixels. The substrate has a first display region and a second display region connected to the first display region. The plurality of passive pixels are located on the first display region. The plurality of active pixels are located on the second display region.

An embodiment of the invention provides a display device including a substrate, at least one driving circuit, an active element, an insulating layer, a first electrode, a second electrode, a first luminescent layer, a second luminescent layer, and a third electrode. The substrate has a first display region and a second display region connected to the first display region. The at least one driving circuit is located on the substrate, the active element is located on the second display region, and the active element is electrically connected to the at least one driving circuit. The insulating layer covers the active element. The first electrode and the second electrode are located on the insulating layer, and the position of the first electrode corresponds to the first display region, and the position of the second electrode corresponds to the second display region. The first electrode is electrically connected to the at least one driving circuit, and the second electrode is electrically connected to the active element. The third electrode is located on the first electrode and the second electrode. The first luminescent layer is disposed between the first electrode and the third electrode, and the position of the first luminescent layer corresponds to the first display region, and the second luminescent layer is disposed between the second electrode and the third electrode, and the position of the second luminescent layer corresponds to the second display region.

The above described features and advantages of the present invention will be more apparent from the following description.

BRIEF DESCRIPTION OF THE DRAWINGS

FIG. 3 is a schematic top view of a display device in accordance with an embodiment of the present invention.

DESCRIPTION OF THE EMBODIMENTS

Figure 1A:
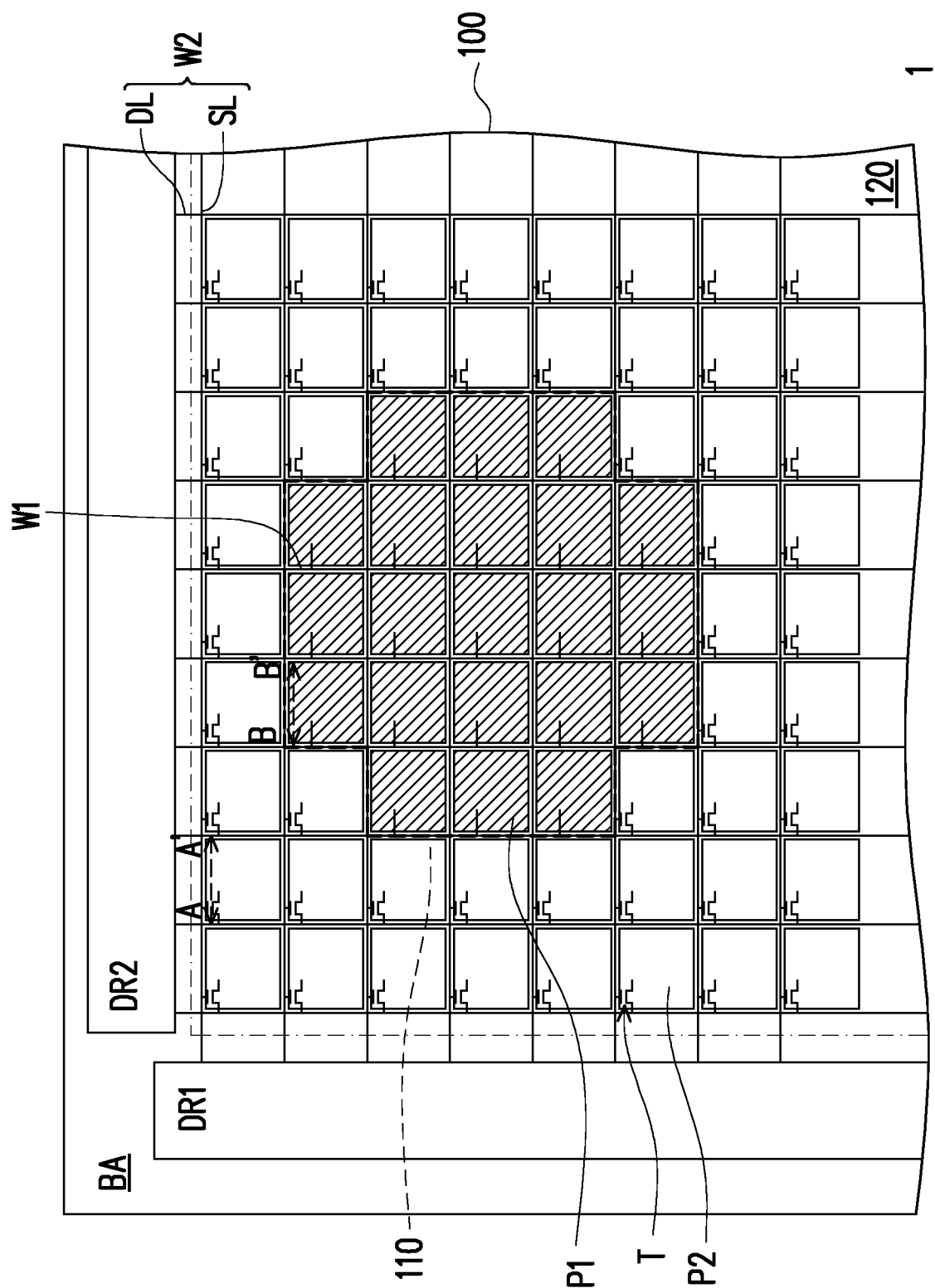
FIG. 1A is a schematic top view of a display device in accordance with an embodiment of the present invention.
Figure 1B:
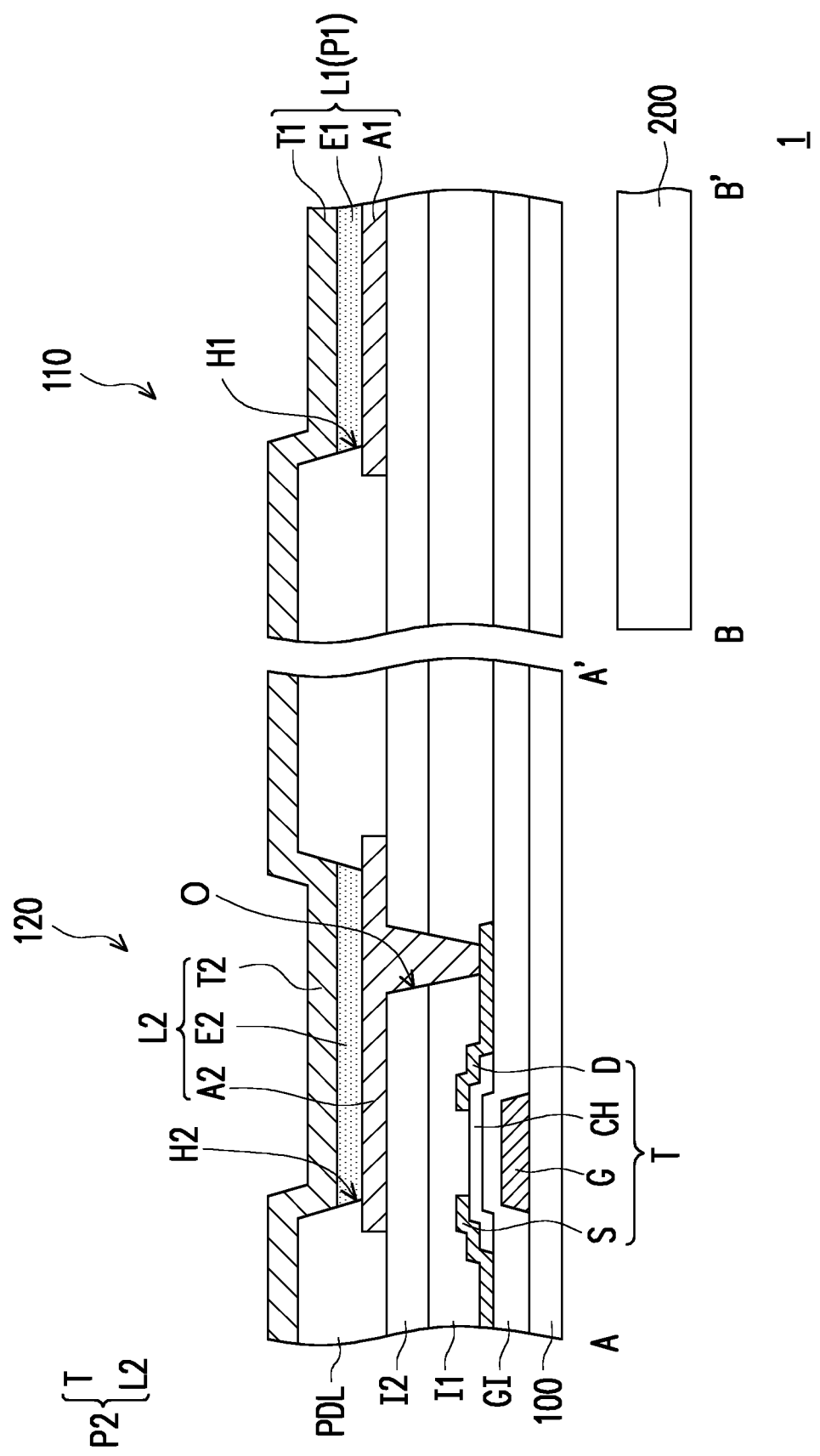
FIG. 1B is a schematic cross-sectional view taken along line AA' and line BB' of FIG. 1A.

FIG. 1A is a schematic top view of a display device in accordance with an embodiment of the present invention. FIG. 1B is a schematic cross-sectional view taken along line AA' and line BB' of FIG. 1A. For convenience of description, FIG. 1A omits some components, for example, the first pixel in FIG. 1A is only drawn with a simple rectangle, and the second pixel is only drawn with a simple rectangle plus the circuit symbol of the active element.

Referring to FIG. 1A and FIG. 1B, a display device 1 includes a substrate 100, a plurality of first pixels P1, and a plurality of second pixels P2. In this embodiment, the display device 1 further includes at least one driving circuit DR, a plurality of first traces W1, and a plurality of second traces W2. The substrate 100 has a display region AA including a first display region 110 and a second display region 120 adjacent to the first display region 110. In this embodiment, the second display region 120 surrounds the first display region 110, but the invention is not limited thereto. In this embodiment, the substrate 100 further has a peripheral region BA, the peripheral region BA surrounds the display region AA, and the driving circuit DR is located on the peripheral region BA of the substrate 100, but the invention is not limited thereto. In other embodiments, there is no or little the peripheral region BA in substrate 100, and the driving circuit DR is disposed on the display region AA of the substrate 100 and/or the back side of the substrate 100. In this embodiment, the driving circuit DR includes a first driving circuit DR1 and a second driving circuit DR2, and the plurality of first traces W1 and the plurality of second traces W2 are disposed on the substrate 100, and the plurality of first pixels P1 and the plurality of second pixels P2 are electrically connected to the driving circuit DR through the plurality of first traces W1 or the plurality of second traces W2.

The plurality of second pixels P2 are located on the second display region 120. In this embodiment, each of the second pixels P2 is an active pixel, and each of the second pixels P2 includes an active element T and a second light-emitting diode L2. In the present embodiment, each of the second pixels P2 includes, for example, one active element T and one second light-emitting diode L2, but the invention is not limited thereto. In other embodiments, each of the second pixels P2 includes a plurality of active elements T and a plurality of second light emitting diodes L2. In other words, each second pixel P2 includes a plurality of sub-pixels.

In detail, the active element T is located on the second display region 120 of the substrate 100, and the active element T is electrically connected to the driving circuit DR. In this embodiment, the second traces W2 are electrically connected to the active elements T and the driving circuit DR, wherein the second traces W2 includes data lines DL and scan lines SL. In the embodiment of FIG. 1B, each active element T includes a channel layer CH, a gate G, a source S, and a drain D. The gate G is electrically connected to the scan line SL and electrically connected to the first driving circuit DR1 through the scan line SL. The gate G overlaps the channel layer CH, and the gate insulating layer GI is interposed between the gate G and the channel layer CH. The source S and the drain D are located on the channel layer CH and are electrically connected to the channel layer CH. The source S is electrically connected to the data line DL and electrically connected to the second driving circuit DR2 through the data line DL.

In the present embodiment, the active element T is exemplified by a bottom-gate type thin film transistor, but the invention is not limited thereto. In other embodiments, the active element T can also be a top-gate type thin film transistor or other type of thin film transistor.

The second light-emitting diode L2 is electrically connected to the active element T. In detail, referring to FIG. 1B, the second light-emitting diode L2 includes a second electrode A2, a second luminescent layer E2, and a third electrode T2. The first insulating layer I1 is located on the active element T, in other words, the first insulating layer I1 is located on the gate insulating layer GI, the source S and the drain D. In this embodiment, the second insulating layer I2 is disposed on the first insulating layer I1, so that two insulating layers are disposed between the active element T and the second light-emitting diode L2, but the invention is not limited thereto. The number of the insulating layers is increased or decreased according to the characteristics of different active elements or other process considerations. The second electrode A2 is located on the first insulating layer I1 (also on the second insulating layer I2), and the position thereof corresponds to the second display region 120. In the second pixel P2 of the embodiment, the second light-emitting diode L2 is electrically connected to the active element T. The second electrode A2 is electrically connected to the drain D of the active element T through the opening O, wherein the opening O penetrates through the first insulating layer I1 and the second insulating layer I2, so that the second electrode A2 may be electrically connected to the active element T via the opening O. The pixel defining layer PDL is located on the second insulating layer I2 and has an opening H2, and the second luminescent layer E2 is located in the opening H2. In detail, the opening H2 is formed in the pixel defining layer PDL, and the forming position of the opening H2 corresponds to the second electrode A2, such that when the second luminescent layer E2 is located in the opening H2, the position of the second luminescent layer E2 also corresponds to the second electrode A2. In this embodiment, the third electrode T2 is located on the pixel defining layer PDL and the second luminescent layer E2, so that the second luminescent layer E2 is disposed between the second electrode A2 and the third electrode T2. Accordingly, the brightness of the second luminescent layer E2 is controlled by the driving properties (such as voltage, current, electric field, etc.) of the second electrode A2 and the third electrode T2. In other words, in the second pixel P2 of the embodiment, an electrical driving signal is input to the active element T to control the brightness of the second light-emitting diode L2, such that the second pixel P2 is as an active pixel. For example, when the second light-emitting diode L2 is an organic light-emitting diode, the second pixel P2 is an Active-Matrix Organic Light-Emitting Diode (AMOLED).

The plurality of first pixels P1 are located on the first display region 110. In this embodiment, each of the first pixels P1 is a passive pixel, and each of the first pixels P1 includes a first light-emitting diode L1. In the present embodiment, each of the first pixels P1 includes, for example, one first light-emitting diode L1, but the invention is not limited thereto. In other embodiments, each of the first pixels P1 includes a plurality of first light-emitting diodes L1. In other words, each of the first pixels P1 includes a plurality of sub-pixels.

Referring to FIG. 1A and FIG. 1B, the first light-emitting diode L1 is electrically connected to the driving circuit DR. In this embodiment, the first traces W1 are electrically connected to the first light-emitting diodes L1 and the driving circuit DR. In the present embodiment, the first traces W1 and some of the data lines DL connected to the active elements T are substantially the same wires. In other words, the first traces W1 are connected to some of the second traces W2, but the invention is not limited thereto. In other embodiments, the first traces W1 and the second traces W2 are separated from each other. The first light-emitting diode L1 includes a first electrode A1, a first luminescent layer E1, and a third electrode T1. The first electrode A1 is located on the first insulating layer I1 (also on the second insulating layer I2), and the position of the first electrode A1 corresponds to the first display region 110. In this embodiment, the first electrode A1 is electrically connected to the second driving circuit DR2 through the data line DL. Referring to the first pixel P1 of FIG. 1B, the pixel defining layer PDL is located on the second insulating layer I2 and has an opening H1, and the first luminescent layer E1 is located in the opening H1. In detail, the opening H1 is formed in the pixel defining layer PDL, and the forming position of the opening H1 corresponds to the first electrode A1, so that when the first luminescent layer E1 is located in the opening H1, the position of the first luminescent layer E1 also corresponds to the first electrode A1. In this embodiment, the third electrode T1 is located on the pixel defining layer PDL and the first luminescent layer E1, such that the first luminescent layer E1 is disposed between the first electrode A1 and the third electrode T1. Accordingly, the brightness of the first light-emitting layer E1 is controlled by the driving properties (such as voltage, current, electric field, etc.) of the first electrode A1 and the third electrode T1. In other words, in the first pixel P1 of the embodiment, the driving circuit DR directly transmits the electrical driving signal to the first light-emitting diode L1 without the active element (such as the active element T of the second pixel P2) to control the brightness of the first light-emitting diode L1, such that the first pixel P1 is as a passive pixel. For example, when the first light-emitting diode L1 is an organic light-emitting diode, the first pixel P1 is a Passive-Matrix Organic Light-Emitting Diode (PMOLED).

In this embodiment, the third electrode T1 of the first light-emitting diode L1 and the third electrode T2 of the second light-emitting diode L2 are electrically connected to each other and are integrally formed. In other words, the third electrode T1 (or T2) substantially covers the entire first display region and the entire second display region. For example, each of the first electrode A1 and the second electrode A2 is an anode of the light-emitting diode, the first electrode A1 and the second electrode A2 are structurally separated, and the first electrode A1 and the second electrode A2 are formed through the same mask. The third electrode T1 (or T2) is a cathode of the light-emitting diode, and is entirely formed on the first display region and the second display region, so that the third electrode T1 (corresponding to the first display region) and the third electrode T2 (corresponding to the second display region) are made of the same material and are in the same layer. In this embodiment, the first light-emitting diodes L1 and the second light-emitting diodes are electrically connected to the same second driving circuit DR2, but the invention is not limited thereto. In other embodiments, the driving circuit for controlling the second light-emitting diodes L2 is separated from the driving circuit for controlling the first light-emitting diodes L1. In other words, the second light-emitting diodes L2 are electrically connected to other driving circuits by other signal lines, and not have to be electrically connected to the second driving circuit DR2 by the data lines DL.

In the present embodiment, the area of the first pixel P1 and the area of the second pixel P2 are defined by the pixel definition layer PDL. In some embodiments, the area of the first pixel P1 or the area of the second pixel P2 is substantially equal to the area surrounded by the corresponding two scan lines and the corresponding two data lines, but the invention is not limited thereto.

In some embodiments, an area of the vertical projection of the first light-emitting diode L1 on the substrate 100 is substantially the same as an area of the vertical projection of the second light-emitting diode L2 on the substrate 100. In some embodiments, the area of the vertical projection of the first pixel P1 on the substrate 100 is substantially the same as the area of the vertical projection of the second pixel P2 on the substrate 100. In other words, the resolution of the display device 1 corresponding to the first display region 110 is substantially equal to the resolution of the display device 1 corresponding to the second display region 120, but the invention is not limited thereto. In other embodiments, the resolution of the display device 1 corresponding to the first display region 110 is different from the resolution of the display device 1 corresponding to the second display region 120.

In the present embodiment, the first light-emitting diode L1 is exemplified by an organic light-emitting diode and the second light-emitting diode L2 is exemplified by an organic light-emitting diode, but the invention is not limited thereto. In other embodiments, the first light-emitting diode L1 and the second light-emitting diode L2 are micro-light-emitting diodes (micro-LEDs) and comprise an inorganic luminescent layer.

In the present embodiment, the first pixel P1 does not have an active element, that is, the circuit in the first pixel P1 is simpler than the second pixel P2. Therefore, the first pixel P1 has a higher transmittance than the second pixel P2.

The position of an optical module 200 corresponds to the first display region 110. The optical module 200 is disposed on the first display region 110 on the back surface of the substrate 100. The optical module 200 is, for example, a charge-coupled device, a 3D sensor, an iris recognition device, or the like. When the photographing function is to be performed, the image passes through the first display region 110 and reaches the optical module 200. Further, since the first pixels P1 on the first display region 110 have displaying function. Therefore, when the photographing function is not required to be performed, the first pixels P1 on the first display region 110 displays an icon (Icon) such as a battery power, a network signal, or other images. In other words, in this embodiment, the passive pixels P1 are on the first display region 110, so that the position of the optical module 200 corresponds to the passive pixels P1. In this way, the passive pixels P1 can provide a higher transmittance, thereby increasing the performance of the optical module 200, and the passive pixels P1 have the displaying function to enable the first display region 110 to display, thereby the performance of the optical module 200 is provided. In addition, from the perspective of the user, the display device of the embodiment can realize the displaying function of the full screen, and the physical structure of the optical module 200 is not easily seen by the user, and the usability of the optical module 200 is also achieved, thereby increasing the aesthetics of the display device and display quality.

Based on the above, since the display device 1 includes the first pixels P1 and the second pixels P2, the display device 1 has a higher transmittance, and the area of the region capable of displaying images of the display device 1 is increased, thereby obtaining the advantage of a narrow border or borderless.

Figure 2A:
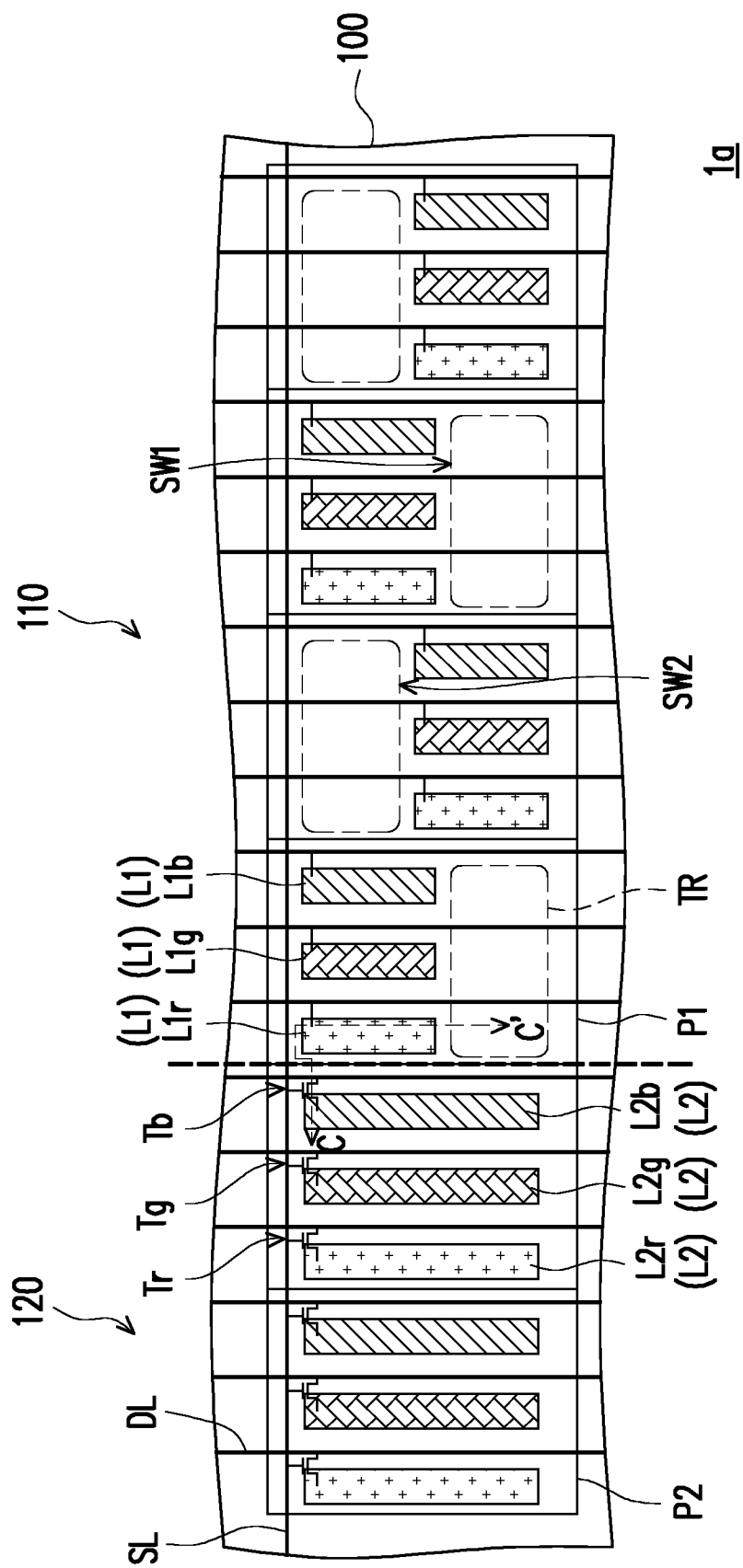
FIG. 2A is a schematic top view of a display device in accordance with an embodiment of the present invention.
Figure 2B:
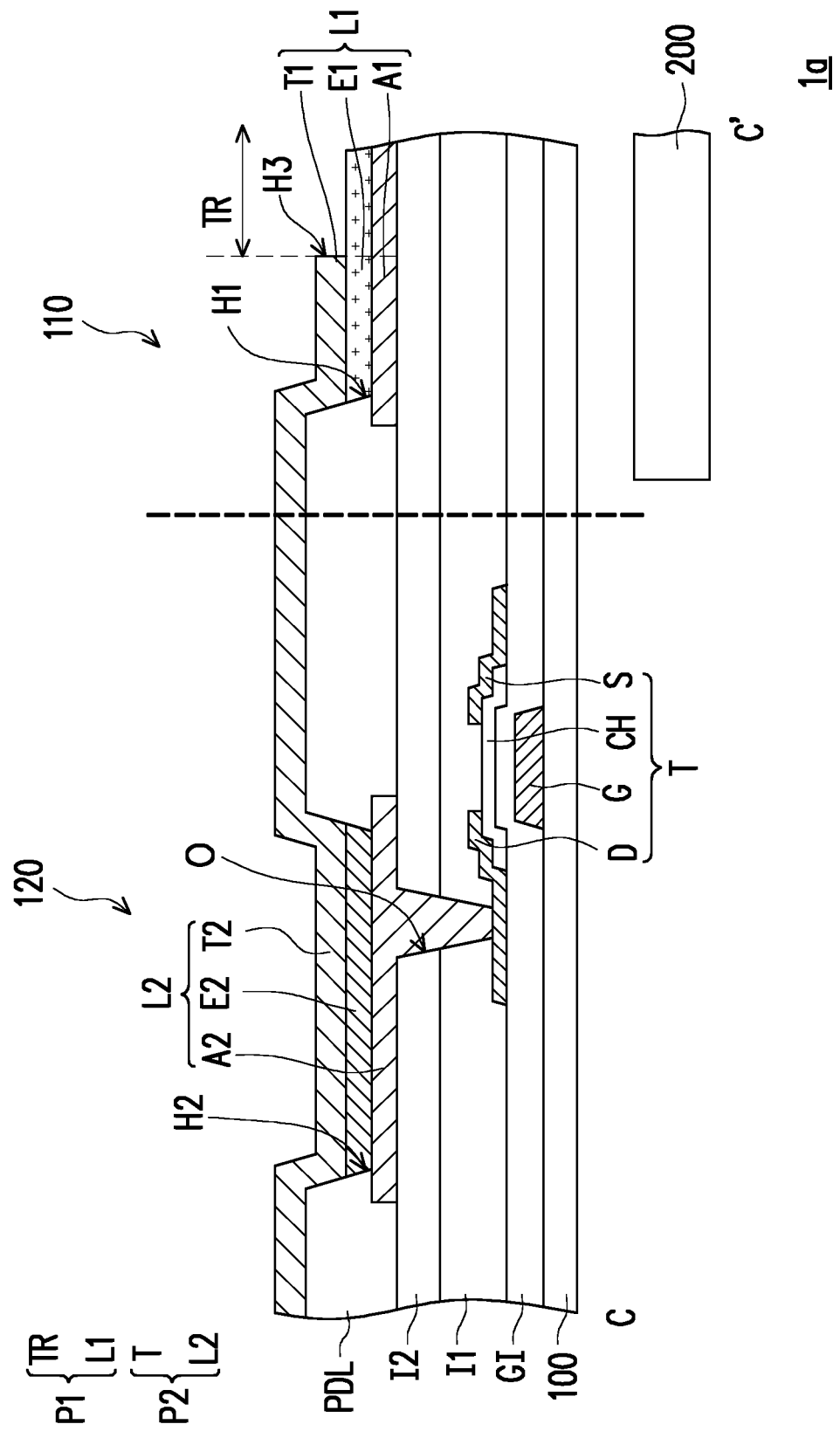
FIG. 2B is a schematic cross-sectional view taken along line CC' of FIG. 2A.

FIG. 2A is a schematic top view of a display device in accordance with an embodiment of the present invention. FIG. 2B is a schematic cross-sectional view taken along line CC' of FIG. 2A. It is to be noted that reference numerals and a part of contents of the embodiment of FIG. 1A and FIG. 1B are adopted in the embodiment of FIG. 2A and FIG. 2B, wherein the same or similar elements are represented by the same or similar reference numerals, and descriptions of the same technical contents are omitted. The aforementioned embodiment may be referred for descriptions of the omitted parts, and detailed descriptions thereof are not repeated in the following embodiment.

Referring to FIG. 2A and FIG. 2B, in this embodiment, each first pixel P1 (passive pixel) of a display device 1a includes a plurality of first light-emitting diodes L1 (e.g. a first red light-emitting diode L1r, a first green light-emitting diode L1g and a first blue light-emitting diode L1b) and a transparent region TR. The transparent region TR is located on the side of the first light-emitting diode L1.

The first red light-emitting diode L1r, the first green light-emitting diode L1g, and the first blue light-emitting diode L1b are electrically connected to the same scan line SL, respectively, and the first red light-emitting diode L1r, the first green light-emitting diode L1g and the first blue light-emitting diode L1b are electrically connected to different data lines DL. The number of the first light-emitting diodes L1 in the first pixel P1 is adjusted according to actual needs.

In the embodiment of FIG. 2A and FIG. 2B, the stacked structures of the first light-emitting diode L1 and the second light-emitting diode L2 are the same as those of the embodiment of FIG. 1A and FIG. 1B, and are not described herein. In this embodiment, the first pixel P1 further includes the transparent region TR, which can increase the transmittance of the first pixel P1, thereby improving the performance and sensitivity of the optical module 200. Specifically, the third electrode T1 has an opening H3 corresponding to the transparent region TR. In other words, the third electrode T1 is not disposed in the transparent region TR, so that the transparent region TR has a higher transmittance. In other modifications, in addition to the third electrode T1, the opening H3 is formed in other layers. In other words, except the third electrode T1 is not disposed in the transparent region TR, other layers (e.g. the first luminescent layer E1, the first electrode A1, the insulating layer) are not disposed in the transparent region TR.

Figure 5:
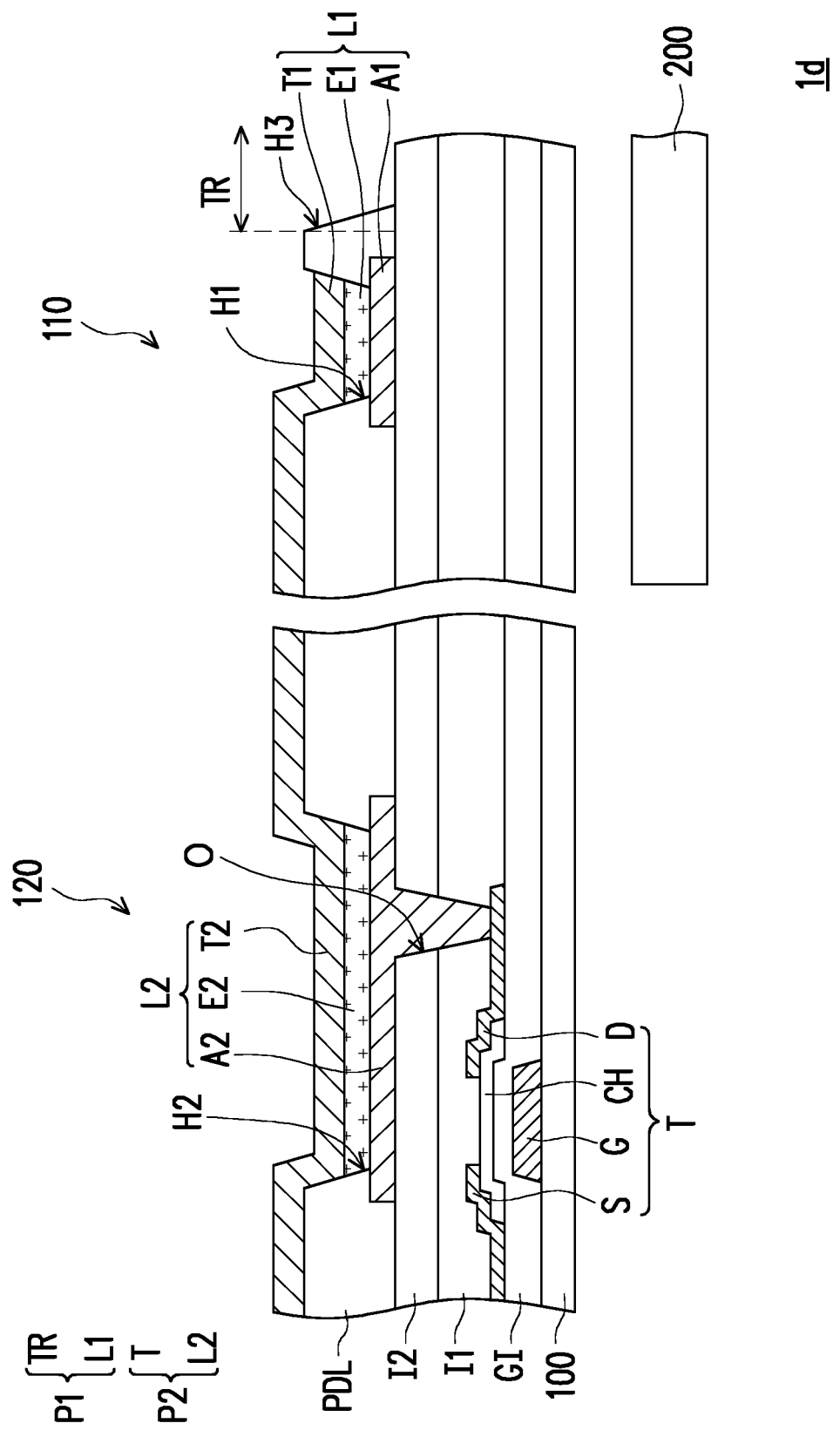
FIG. 5 is a schematic cross-sectional view of a display device in accordance with an embodiment of the present invention.

In the present embodiment, part of the opening H1 of the pixel defining layer PDL is overlapped with the transparent region TR. Therefore, part of the first luminescent layer E1 is located in the transparent region TR, but the invention is not limited thereto. In other embodiments, the opening H1 of the pixel defining layer PDL does not overlap the transparent region TR, and the first luminescent layer E1 is not disposed in the transparent region TR, as shown in FIG. 5.

In this embodiment, each second pixel P2 (active pixel) of the display device 1a includes a plurality of active elements T (e.g. an active element Tr, an active element Tg, and an active element Tb), and a plurality of second light-emitting diodes L2 (e.g. a second red light-emitting diode L2r, a second green light-emitting diode L2g, and a second blue light-emitting diode L2b). The second red light-emitting diode L2r, the second green light-emitting diode L2g, and the second blue light-emitting diode L2b are electrically connected to the active element Tr, the active element Tg, and the active element Tb, respectively. The active element Tr, the active element Tg, and the active element Tb are electrically connected to the same scan line SL, and the active element Tr, the active element Tg, and the active element Tb are electrically connected to different data lines DL. The number of the active elements T and the number of the second light-emitting diodes L2 in each of the second pixels P2 can be adjusted according to actual needs.

The first light-emitting diode L1 of some of the first pixels P1 (passive pixel) is located on the first side SW1 of the transparent region TR, and the first light-emitting diode L1 of the other of the first pixels P1 (passive pixel) is located at the second side SW2 of the transparent region TR, the first side SW1 is different from the second side SW2. And, the first pixel P1 of which the first light-emitting diode L1 located at the first side SW1 of the transparent region TR and the first pixel P1 of which the first light-emitting diode L1 located at the second side SW2 of the transparent region TR are alternately arranged. Thereby, the transmittance of the display device corresponding to the first display region 110 can be distributed more uniformly.

FIG. 3 is a schematic top view of a display device in accordance with an embodiment of the present invention. It should be noted that reference numerals and a part of contents of the embodiment of FIG. 2A and FIG. 2B are adopted in the embodiment of FIG. 3, wherein the same or similar elements are represented by the same or similar reference numerals, and descriptions of the same technical contents are omitted. The aforementioned embodiment may be referred for descriptions of the omitted parts, and detailed descriptions thereof are not repeated in the following embodiment.

Referring to FIG. 3, each second pixel P2 (active pixel) of a display device 1b includes a plurality of active elements T (e.g. an active element Tr, an active element Tg, an active element Tb, and an active element Tw), a plurality of second light-emitting diode L2 (e.g. a second red light-emitting diode L2r, a second green light-emitting diode L2g, a second blue light-emitting diode L2b, and a second white light-emitting diode L2w). The second red light-emitting diode L2r, the second green light-emitting diode L2g, the second blue light-emitting diode L2b, and the second white light-emitting diode L2w are electrically connected to the active element Tr, the active element Tg, the active element Tb and the active element Tw, respectively.

In the present embodiment, the second pixel P2 includes, for example, the second red light-emitting diode L2r, the second green light-emitting diode L2g, the second blue light-emitting diode L2b, and the second white light-emitting diode L2w, but the invention is not limited thereto. The second pixel P2 may further include light-emitting diodes of other colors. In this embodiment, the second white light-emitting diode L2w can make the second pixel P2 have a higher transmittance.

Figure 4:
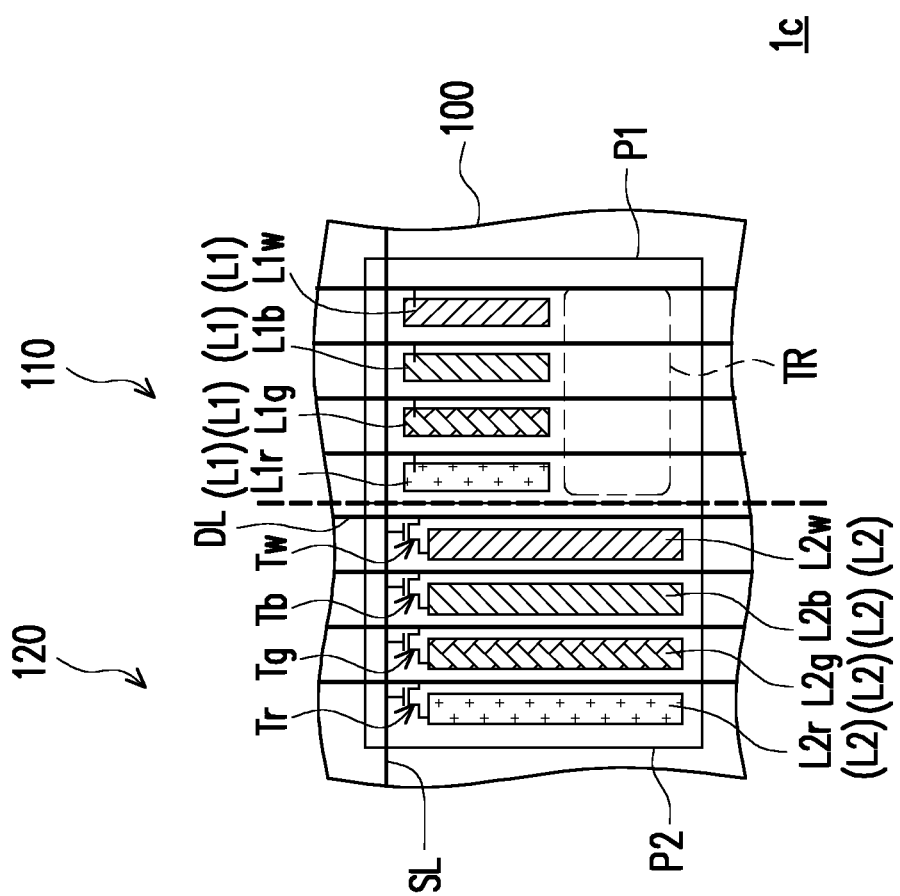
FIG. 4 is a schematic top view of a display device in accordance with an embodiment of the present invention.

FIG. 4 is a schematic top view of a display device in accordance with an embodiment of the present invention. It is to be noted that reference numerals and a part of contents of the embodiment of FIG. 3 are adopted in the embodiment of FIG. 4, wherein the same or similar elements are represented by the same or similar reference numerals, and the descriptions of the same technical contents are omitted. The aforementioned embodiment may be referred for descriptions of the omitted parts, and detailed descriptions thereof are not repeated in the following embodiment.

Referring to FIG. 4, each first pixel P1 (passive pixel) of a display device 1c includes a plurality of first light-emitting diodes L1 (e.g. a first red light-emitting diode L1r, a first green light-emitting diode L1g, a first blue light-emitting diode L1b and a first white light-emitting diode L1w) and a transparent region TR.

In the present embodiment, the first pixel P1 includes, for example, the first red light-emitting diode L1r, the first green light-emitting diode L1g, the first blue light-emitting diode L1b, and the first white light-emitting diode L1w, but the invention is not limited thereto.

The first pixel P1 further includes light-emitting diodes of other colors. In the present embodiment, the first white light-emitting diode L1w can make the first pixel P1 have a higher transmittance.

FIG. 5 is a schematic cross-sectional view of a display device in accordance with an embodiment of the present invention. It should be noted that reference numerals and a part of contents of the embodiment of FIG. 2A and FIG. 2B are adopted in the embodiment of FIG. 5, wherein the same or similar elements are represented by the same or similar reference numerals, and descriptions of the same technical contents are omitted. The aforementioned embodiment may be referred for descriptions of the omitted parts, and detailed descriptions thereof are not repeated in the following embodiment.

The difference between the display device 1d of FIG. 5 and the display device 1a of FIG. 2B is that in the first pixel P1 of the display device 1d, the first light-emitting layer E1 is not disposed in the transparent region TR.

In the present embodiment, the opening H1 of the pixel defining layer PDL does not overlap the transparent region TR, and the first luminescent layer E1 and the first electrode A1 are not disposed in the transparent region TR. Therefore, the transparent region TR has a higher transmittance.

In embodiments of the present invention, the display device includes two different pixels, the first pixel and the second pixel, which can increase the area of the region capable of displaying images, thereby obtaining the advantage of a narrow border or borderless.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A display device, comprising:
   a substrate having a first display region and a second display region adjacent to the first display region;
   a plurality of passive pixels located on the first display region;
   a plurality of active pixels located on the second display region;
   at least one driving circuit located on the substrate;
   an optical module, a position of the optical module is corresponding to the first display region;
   a first trace disposed on the substrate; and
   a second trace disposed on the substrate,
   wherein each of the passive pixels includes a first light-emitting diode, and the first trace is electrically connected to the first light-emitting diode and the driving circuit, and
   each of the active pixels includes an active element and a second light-emitting diode, the second trace is electrically connected to the active element and the driving circuit, and the active element is electrically connected to the second light-emitting diode.

2. The display device of claim 1, wherein an area of a vertical projection of each of the active pixels on the substrate is the same as an area of a vertical projection of each of the passive pixels on the substrate.

3. The display device of claim 1, wherein each of the passive pixels comprises:
   a first light-emitting diode; and
   a transparent region located on a side of the first light-emitting diode.

4. The display device of claim 3, wherein the first light-emitting diodes of a portion of the passive pixels are located on a first side of the transparent regions, and the first light-emitting diodes of another portion of the passive pixels are located on a second side of the transparent regions, wherein the first side is different from the second side, and the portion of the passive pixels and the another portion of the passive pixels are alternately arranged with each other.

5. The display device of claim 1, wherein each of the active pixels comprises a second red light-emitting diode, a second green light-emitting diode, a second blue light-emitting diode, and a second white light-emitting diode.

6. The display device of claim 5, wherein each of the passive pixels comprises a first red light-emitting diode, a first green light-emitting diode, and a first blue light-emitting diode.

7. The display device of claim 1, wherein each of the passive pixels comprises a first red light-emitting diode, a first green light-emitting diode, a first blue light-emitting diode, and a first white light-emitting diode.

8. A display device, comprising:
   a substrate having a first display region and a second display region connected to the first display region;
   at least one driving circuit located on the substrate;
   an active element located on the second display region and electrically adjacent to the at least one driving circuit;
   an insulating layer covering the active element;
   a first electrode and a second electrode disposed on the insulating layer, wherein a position of the first electrode position corresponds to the first display region, a position of the second electrode position corresponds to the second display region, the first electrode is electrically connected to the at least one driving circuit, and the second electrode is electrically connected to the active element;
   a third electrode located on the first electrode and the second electrode;
   a first luminescent layer disposed between the first electrode and the third electrode, wherein a position of the first luminescent layer corresponds to the first display region;
   a second luminescent layer disposed between the second electrode and the third electrode, wherein a position of the second luminescent layer corresponds to the second display region; and
   an optical module, a position of the optical module corresponding to the first display region.

9. The display device of claim 8, further comprising a plurality of first pixels and a plurality of second pixels, respectively located on the first display region and the second display region, wherein
   each of the first pixels includes a first light-emitting diode, and the first light-emitting diode includes the first electrode, the first luminescent layer and the third electrode, and each of the second pixels includes the active element and a second light-emitting diode, the second light-emitting diode includes the second electrode, the second luminescent layer and the third electrode.

10. The display device of claim 9, wherein an area of a vertical projection of each of the first pixels on the substrate is the same as an area of a vertical projection of each of the second pixels on the substrate.

11. The display device of claim 9, wherein each of the first pixels further comprises:
    a transparent region located on a side of the first light-emitting diode; and
    an opening disposed in the third electrode, wherein a position of the opening corresponds to the transparent region.

12. The display device of claim 11, wherein the first light-emitting diodes of a portion of the first pixels are located on a first side of the transparent regions, and the first light-emitting diodes of the another portion of the first pixels are located on a second side of the transparent regions, the first side is different from the second side.

13. The display device of claim 9, wherein each of the second pixels comprises a second red light-emitting diode, a second green light-emitting diode, a second blue light-emitting diode, and a second white light-emitting diode.

14. The display device of claim 9, wherein each of the first pixels comprises a first red light-emitting diode, a first green light-emitting diode, and a first blue light-emitting diode.

15. The display device of claim 9, wherein each of the first pixels comprises a first red light-emitting diode, a first green light-emitting diode, a first blue light-emitting diode, and a first white light-emitting diode.

16. The display device of claim 9, wherein the first light-emitting diodes are electrically connected to the second light-emitting diodes.

* * * * *